United States Patent
Smith et al.

(10) Patent No.: US 7,160,623 B2
(45) Date of Patent: *Jan. 9, 2007

(54) MELT-PROCESSIBLE POLY(TETRAFLUOROETHYLENE)

(75) Inventors: Paul Smith, Zurich (CH); Jeroen Visjager, Zurich (CH); Cees Bastiaansen, Maastricht (NL); Theodorus Tervoort, Zurich (CH)

(73) Assignee: Eidgenossische Technische Hochschule Zurich, Zurich (CH)

( * ) Notice: Subject to any disclaimer, the term of this patent is extended or adjusted under 35 U.S.C. 154(b) by 0 days.

This patent is subject to a terminal disclaimer.

(21) Appl. No.: 10/322,779

(22) Filed: Dec. 19, 2002

(65) Prior Publication Data

US 2004/0019167 A1  Jan. 29, 2004

Related U.S. Application Data (60) Continuation of application No. 10/059,132, filed on Jan. 31, 2002, now Pat. No. 6,548,612, which is a division of application No. 09/369,319, filed on Aug. 6, 1999, now Pat. No. 6,531,559.

(60) Provisional application No. 60/095,583, filed on Aug. 6, 1998.

(51) Int. Cl.
*B32B 27/28* (2006.01)
*D01D 5/08* (2006.01)

(52) U.S. Cl. ............ 428/422; 428/421; 526/242; 526/247; 526/255; 264/172.17; 264/205; 264/464; 264/478

(58) Field of Classification Search ......... 526/255, 526/242, 247; 428/421, 422
See application file for complete search history.

(56) References Cited

U.S. PATENT DOCUMENTS

| | | | |
|---|---|---|---|
| 2,946,763 A | 7/1960 | Bro et al. | |
| 3,132,123 A | 5/1964 | Harris, Jr. et al. | |
| 3,142,665 A | 7/1964 | Cardinal et al. | |
| 3,635,926 A | 1/1972 | Gresham et al. | |
| 3,655,853 A | 4/1972 | Gallup et al. | |
| 3,770,711 A | 11/1973 | Hartig et al. | |
| 3,953,412 A | 4/1976 | Saito et al. | |
| 3,953,566 A | 4/1976 | Gore | |
| 3,956,000 A | 5/1976 | Kuhls et al. | |
| 3,962,153 A | 6/1976 | Gore | |
| 4,029,868 A | 6/1977 | Carlson | |
| 4,036,802 A | 7/1977 | Poirer | |
| 4,064,214 A | 12/1977 | Fitzgerald | |
| 4,078,134 A | 3/1978 | Kuhls et al. | |
| 4,078,135 A | 3/1978 | Sulzbach et al. | |
| 4,360,488 A | 11/1982 | Barham | |
| 4,385,026 A | 5/1983 | Barham | |
| 4,522,995 A | 6/1985 | Anderson et al. | |
| 4,624,990 A | 11/1986 | Lunk et al. | |
| 4,714,756 A | 12/1987 | Buckmaster et al. | |
| 4,749,752 A | 6/1988 | Youlu et al. | |
| 4,859,836 A * | 8/1989 | Lunk et al. ........... | 219/548 |
| 4,898,779 A | 2/1990 | Yoshimura et al. | |
| 5,176,958 A | 1/1993 | Shimizu et al. | |
| 5,317,061 A | 5/1994 | Chu et al. | |
| 5,420,191 A | 5/1995 | Howard, Jr. et al. | |
| 5,547,761 A | 8/1996 | Chapman, Jr. et al. | |
| 5,603,999 A | 2/1997 | Namura et al. | |
| 5,641,571 A | 6/1997 | Mayer et al. | |
| 5,646,223 A | 7/1997 | Navarrini et al. | |
| 5,709,944 A | 1/1998 | Kokumai et al. | |
| 5,814,405 A | 9/1998 | Branca et al. | |
| 5,822,489 A | 10/1998 | Hale | |
| 5,874,171 A | 2/1999 | Wagner et al. | |
| 6,060,167 A | 5/2000 | Morgan et al. | |
| 6,066,707 A | 5/2000 | Colaianna et al. | |
| 6,207,275 B1 | 3/2001 | Heffner et al. | |
| 6,218,000 B1 | 4/2001 | Rudolf et al. | |
| 6,265,492 B1 | 7/2001 | Lahijani | |
| 6,531,559 B1 | 3/2003 | Smith et al. | |
| 6,548,612 B1 | 4/2003 | Smith et al. | |
| 2003/0069343 A1 | 4/2003 | Smith et al. | |

FOREIGN PATENT DOCUMENTS

| | | |
|---|---|---|
| DE | 4112248 A1 | 10/1992 |
| DE | 29718243 | 2/1998 |
| EP | 0010152 | 4/1980 |
| EP | 1000975 | 5/2000 |
| GB | 795361 | 5/1958 |
| GB | 1116210 | 6/1968 |
| WO | 94/02547 | 3/1994 |
| WO | 94/15998 | 7/1994 |
| WO | 97/43102 | 11/1997 |
| WO | 98/58105 | 12/1998 |
| WO | 98/58984 | 12/1998 |
| WO | 99/41313 | 8/1999 |
| WO | 00/08071 | 2/2000 |

OTHER PUBLICATIONS

H.W. Starkweather, Jr., "The Effect of Heating Rate on the Melting of Polytetrafluoroethylene," Journal of Polymer Physics: Polymer Physics Edition, 1985, vol. 23, pp. 1177-1185.

(Continued)

*Primary Examiner*—Helen L. Pezzuto
(74) *Attorney, Agent, or Firm*—Jones Day (57) ABSTRACT

Melt-processible, thermoplastic poly(tetrafluoroethylene) (PTFE) compositions are disclosed and methods for making and processing same. Additionally, products comprising these compositions are described.

31 Claims, 2 Drawing Sheets

OTHER PUBLICATIONS

R. Endo et al., "Development of High Ductility and Tensile Properties by Two-Stage Draw of Poly(tetrafluoroethylene) Virgin Powder above the Static Melting Temperature," Journal of Polymer Physics: Part B: Polymer Physics, 1998, vol. 36, pp. 1419-1422.

P. Smith and K.H. Gardner, "Dissolution of Poly(tetrafluoroethylene)," Macromolecules, 1985, vol. 18, pp. 1222-1228.

W.H. Tuminello et al., "Dissolving Poly(tetrafluoroethylene) in Low Boiling Halocarbons," Journal of Applied Polymer Science, 1995, vol. 56, pp. 495-499.

W.H. Tuminello and G.T. Dee, "Thermodynamics of Poly(tetrafluoroethylene) Solubility," Macromolecules, 1994, vol. 27, pp. 669-676.

W.H. Tuminello et al., "Dissolving Perfluoropolymers in Supercritical Carbon Dioxide," Macromolecules, 1995, vol. 28, pp. 1506-1510.

M. Takenaga and K. Yamagata, "Evaluation of Number-Average Molecular Weight of Poly(tetrafluoroethylene) Irradiated with γ Rays," Journal of Applied Polymer Science, 1981, vol. 26, pp. 1373-1382.

R. Endo et al., "Uniaxial Drawing of Polytetrafluoroethylene Virgin Powder by Extrusion Plus Cold tensile draw," Journal of Polymer Physics: Part B: Polymer Physics, 1998, vol. 36, 2551-2562.

B. Chu et al., "Light-Scattering Characterization of Poly(tetrafluoroethylene). 2. PTFE in Perfluorotetracosane: Molecular Weight Distribution and Solution Properties," Macromolecules, 1989, vol. 22, 831-837.

H. Okuyama et al., "Solid-State Deformation of Polytetrafluoroethylene Powder," Journal of Materials Science, 1994, vol. 29, pp. 6485-6494.

Ulrich Scheler, "High-speed MAS-NMR investigations on radiation-modified fluoropolymers", Solid State Nuclear Magnetic Resonance, 12 (1998), pp. 9-13.

R. Pucciariello et al., "Extreme Thermal Behavior of Polytetrafluoroethylene and Random Tetrafluoroethylene Fluorinated Copolymers", Journal of Applied Polymer Science, vol. 73 (1999), p. 919-925.

A. Marigo et al., "Lamellar Morphology by Small-Angle X-ray Scattering Measurements in Some Perfluorinated Copolymers of Tetrafluoroethylene", Macromolecules, vol. 29 (1996), p. 2197-2200.

G. Guerra et al., "Structural Variations in Random Copolymers of Tetrafluoroethylene with Kind and Content of Comonomer Units", Polymer, vol. 39 No. 14 (1998), p. 3205-3209.

V. Villani et al., "Calorimetric Study of the Room-Temperature transitions of Tetrafluoroethylene-Hexafluoropropylene Copolymer: Thermal History and Crystalline State", Thermochimica Acta, vol. 199 (1992), p. 247-254.

J. Runt et al., "Crystalline Homopolymer-Copolymer Blends: Poly(tetrafluoroethylene)-Poly(tetrafluoroethylene-co-perfluoroalkylvinyl ether)," Macromolecules, Apr. 1995, vol. 28, Nr. 5, pp. 2781-2786.

"About DuPont Zonyl Fluoroadditives", 3 pages, printed from webpage http://www.dupont.com/teflon.fluoroadditives/about.html on Jul. 7, 1998.

"Why use Dupont Zonyl Fluoroadditives", 2 pages, printed from webpage http://www.dupont.com/teflon.fluoroadditives/whydupont.html on Jul. 7, 1998.

Zonyl "Sales Specifications", 5 pages, printed from webpage http://www.dupont.com/teflon.fluoroadditives/products/salespec.html on Jul. 7, 1998.

"'Zonyl' Fluroadditives all in synonym list zon002" (material safety data sheets), 7 pages, printed from webpage http://www.dupont.com/teflon.fluoroadditives/products/msds/zon002.html on Jul. 7, 1998.

"Zonyl MP 1000" (description), 1 page, Apr. 1996 (printed in Switzerland).

"MP 1000", 3 pages, printed from webpage http://www.dupont.com/teflon.fluoroadditives/products/mp1000.html on Jul. 7, 1998.

"Zonyl MP 1200" promotional sheet, Apr. 1996 (printed in Switzerland).

"MP 1200" Technical Information, 3 pages, printed from webpage http://www.dupont.com/teflon.fluoroadditives/products/mp1200.html on Jul. 7, 1998.

"Zonyl MP 1300" promotional sheet, Apr. 1996 (printed in Switzerland).

"MP 1300" Technical Information, 2 pages, printed from webpage http://www.dupont.com/teflon.fluoroadditives/products/mp1300.html on Jul. 7, 1998.

"Zonyl MP 1400" promotional sheet, Apr. 1996 (printed in Switzerland).

"MP 1400" Technical Information, 2 pages, printed from webpage http://www.dupont.com/teflon.fluoroadditives/products/mp1400.html on Jul. 7, 1998.

"Zonyl MP 1500" promotional sheet, Apr. 1996 (printed in Switzerland).

"MP 1500J" Technical Information, 2 pages, printed from webpage http://www.dupont.com/teflon.fluoroadditives/products/mp1500j.html on Jul. 7, 1998.

"Zonyl MP 1600" promotional sheet, Apr. 1996 (printed in Switzerland).

"MP 1600N" Technical Information, 3 pages, printed from webpage http://www.dupont.com/teflon.fluoroadditives/products/mp1600n.html on Jul. 7, 1998.

J. Schreirs Ed., "Modern Fluoropolymers", Wiley (New York), 1997, Chapter 11, pp. 223-237.

J. Schreirs Ed., "Modern Fluoropolymers", Wiley (New York), 1997, Chapter 12, pp. 239-255.

J. Schreirs Ed., "Modern Fluoropolymers", Wiley (New York), 1997, Chapter 21, pp. 373-396.

J. Schreirs Ed., "Modern Fluoropolymers", Wiley (New York), 1997, Chapter 22, pp. 397-419.

H.W. Starkweather, Jr., "Melting and Crystalline Transitions in Normal Perfloroalkanes and Poly(tetrafluoroethylene)," Macromolecules, 1986, vol. 19, pp. 1131-1134.

W. Starkweather, Jr., "The Heat of Fusion of Copolymers of Tetrafluoroethylene and Hexafluoropropylene," Journal of Polymer Science: Polymer Physics Edition, 1984, vol. 22, pp. 1431-1437.

H.W. Starkweather, Jr. and S. Wu, "Molecular Weight Distributions in Polymers of Tetrafluoroethylene," Polymer, Sep. 1989, vol. 30, pp. 1669-1674.

H.W. Starkweather, Jr. et al., "Infrared Spectra of Amorphous and Crystalline Poly(tetrafluoroethylene)," Macromolecules, 1985, vol. 18, pp. 1684-1686.

W. Starkweather, Jr., et al., Journal of Polymer Science: Polymer Physics Edition, 1982, vol. 20, p. 751-761.

W. Tuminello et al., "Poly(tetrafluoroethylene): Molecular Weight Distributions and Chain Stiffness," Macromolecules, 1988, vol. 21, pp. 2606-2610.

D. Bloor et al. Eds., The Encyclopedia of Advanced Materials, vol. 2, Pergamon (Oxford) 1994, pp. 862-871.

* cited by examiner

MELT-PROCESSIBLE POLY(TETRAFLUOROETHYLENE)

CROSS-REFERENCE TO RELATED APPLICATIONS

This application is a continuation of U.S. Application Ser. No. 10/059,132 filed Jan. 31, 2002 (now U.S. Pat. No. 6,584,612), which is a divisional of U.S. application Ser. No. 09/369,319, filed Aug. 6, 1999 (now U.S. Pat. No. 6,531, 559), which claims the benefit of U.S. provisional application No. 60/095,583, filed Aug. 6, 1998. The entire disclosures of all three prior applications are hereby incorporated by reference.

FIELD OF THE INVENTION

This invention relates to melt-processible poly(tetrafluoroethylene) (PTFE), compositions thereof, articles formed therefrom, and methods for making the same. More particularly, the present inventions relates to a particular range of poly(tetrafluoroethylene) polymers which are readily melt-processible while maintaining good/suitable mechanical properties. Further, the present invention relates to products made of melt-processible, thermoplastic PTFE compositions.

BACKGROUND OF THE INVENTION

Poly(tetrafluoroethylene) (PTFE) is well-known for, among other properties, its chemical resistance, high temperature stability, resistance against ultra-violet radiation, low friction coefficient and low dielectric constant. As a result, it has found numerous applications in harsh physico-chemical environments and other demanding conditions. Equally well-known is the intractability of this important polymer. Numerous textbooks, research articles, product brochures and patents state that PTFE is intractable because, above its crystalline melting temperature, it does not form a fluid phase that is of a viscosity that permits standard melt-processing techniques commonly used for most thermoplastic polymers (Modern Fluoropolymers, J. Scheirs, Ed. Wiley (New York), 1997; The Encyclopaedia of Advanced Materials, Vol. 2, D. Bloor et al. Eds., Pergamon (Oxford) 1994; WO 94/02547; WO 97/43102). Suitability of a polymer for standard melt-processing techniques may be evaluated, for example, through measurement of the melt-flow index of the material (cf. ASTM D1238-88). Melt-processible polymers should, according to this widely employed method, exhibit at least a non-zero value of the melt-flow index, which is not the case for common PTFE under testing conditions that are representative of, and comparable to those encountered in standard polymer melt-processing. The extremely high viscosity of PTFE, reported to be in the range of $10^{10}$–$10^{13}$ Pa.s at 380° C., is believed to be associated, among other things, with an ultra-high molecular weight of the polymer, which has been estimated to be in the regime well above 1,000,000 g/mol and often is quoted to be of the order of 10,000,000 g/mol. In fact, it is claimed (Modern Fluoropolymers, J. Scheirs, Ed. Wiley (New York), 1997, p. 240) that "to achieve mechanical strength and toughness, the molecular weight of PTFE is required to be in the range $10^7$–$10^8$ g/mol . . . ". Due to this high viscosity, common PTFE is processed into useful shapes and objects with techniques that are dissimilar to standard melt-processing methods. Rods, sheets, membranes, fibers and coatings of PTFE are produced by, for example, ram-extrusion, pre-forming and sintering of compressed powder, optionally followed by machining or skiving, paste-extrusion, high isostatic pressure processing, suspension spinning, and the like, and direct plasma polymerization. Unfortunately, these methods generally are less economical than common melt-processing, and, in addition, severely limit the types and characteristics of objects and products that can be manufactured with this unique polymer. For example, common thermoplastic polymers, such as polyethylene, isotactic polypropylene, nylons, poly(methylmethacrylate) polyesters, and the like, can readily be melt-processed into a variety forms and products that are of complex shapes, and/or exhibit, for example, some of the following characteristics: dense, void-free, thin, clear or translucent; i.e. properties that are not readily, if at all, associated with products fabricated from PTFE.

The above drawback of PTFE has been recognised virtually since its invention, and ever since, methods have been developed to circumvent the intractability of the polymer. For example, a variety of co-monomers have been introduced in the PTFE macromolecular chains that lead to co-polymers of reduced viscosity and melting temperature. Co-polymers are those that are polymerized with, for example, hexafluoropropylene, perfluoro(methyl vinyl ether), perfluoro(ethyl vinyl ether), perfluoro(propyl vinyl ether), or perfluoro-(2,2-dimethyl-1,3-dioxole), partially-fluorinated monomers and combinations thereof, in addition to the tetrafluoroethylene monomer. Several of the resulting co-polymers (for example, those referred to as FEP, MFA, PFA and Teflon® AF) provide improved processibility, and can be processed with techniques for common thermoplastic polymers (WO 98/58105). However, a penalty is paid in terms of some or all of the outstanding properties of the homopolymer PTFE, such as reduced melting temperature and thermal and chemical stability.

Additional methods to process the PTFE homopolymer include, for example, the addition of lubricants, plasticizers, and processing aids, as well as oligomeric polyfluorinated substances and hydrocarbyl terminated TFE-oligomers (for example, Vydax® 1000) (U.S. Pat. Nos. 4,360,488; 4,385, 026 and WO 94/02547). The latter method, however, is directed to the improvement of the creep resistance of common PTFE which results in a bimodal morphology with two distinct melting temperatures, and generally does not lead to homogeneous PTFE compositions that can be melt-processed according to standard methods. For example, only a hot-compression molding method is heretofore known for mixtures of standard PTFE and Vydax® 1000, that preferably is carried out in the narrow temperature range between about 330° C. to 338° C. The other aforementioned additions of lubricants, plasticizers, and processing aids also do not yield truly melt-processible PTFE compositions. Solution processing, at superautogeneous pressure, of PTFE from perfluoroalkanes containing 2–20 carbon atoms has been disclosed in WO 94/15998. The latter process is distinctly different from melt-processing methods. Also disclosed is dispersion, and subsequent melt-processing of standard PTFE into thermoplastic (host-) polymers such as polyetheretherketone and polyphenylene sulfide (WO 97/43102) and polyacetal (DE 41 12 248 A1). The latter method compromises important physico-chemical properties of the resulting composition, when compared to neat PTFE, or requires uneconomical and cumbersome removal of the host material.

There exist PTFE grades of low molecular weight and of low viscosity. These grades, which are often are referred to as micropowders, commonly are used as additives in inks, coatings and in thermoplastic and other polymers to impair, for example, nucleation, internal lubrication or other desirable properties that, in part, stem from the unique physicochemical properties of the neat PTFE. Low molecular weight PTFE grades, in their solid form, unfortunately, exhibit extreme brittleness and, according to at least one of the suppliers, these PTFE grades . . . "are not to be used as molding or extrusion powders" (Du Pont, Zonyl® data sheets and url: http://www.dupont.con/teflon/fluoroaddi-tives/about.html—Jul. 7, 1998).

Thus, a need continues to exist to develop melt-processible, thermoplastic poly(tetrafluoroethylene)s to exploit the outstanding properties of this polymer in a wider spectrum of product forms, as well as to enable more economical processing of this unique material.

SUMMARY OF THE INVENTION

Surprisingly, it has been found that poly(tetrafluoroethylene)s of a particular set of physical characteristics provide a solution to the above, unsatisfactory situation.

Accordingly, it is one objective of the present invention to provide melt-processible, thermoplastic PTFE compositions of good mechanical properties comprising PTFE grades that are characterized as having a non-zero melt-flow index in a particular range. As used hereinafter, the indication "good mechanical properties" means the polymer has properties suitable for use in thermoplastic applications, preferably including applications such as melt-processed thermoplastic formed into unoriented, solid fibers or films exhibiting an elongation at break of at least 10%, determined under standard ambient conditions at a rate of elongation of 100% per min.

Yet another object of the present invention is to provide melt-processible PTFE of good mechanical properties that exhibit a plateau value of the complex viscosity measured at frequencies below about 0.01 rad/s and at a temperature of 380° C. that is in a range beneficial for processing.

Another object of the present invention is to provide melt-processible PTFE that in its unoriented solid form has a crystallinity of between about 1% and about 60% and good mechanical properties.

Still another object of the present invention is to provide a melt-blending method that yields melt-processible, thermoplastic PTFE compositions of good mechanical properties comprising PTFE grades that are characterized in having a non-zero melt-flow index in a particular range.

Additionally, it is an object of the present invention to provide a method to melt-process PTFE compositions that comprise PTFE grades that are characterized in having a non-zero melt-flow index in a particular range, into useful shapes and articles of good mechanical properties.

Still another object of the present invention is to provide useful shapes and articles of good mechanical properties that are manufactured by melt-processing of PTFE compositions that comprise PTFE grades that are characterized in having a non-zero melt-flow index in a particular range.

Yet another object of this invention is to provide novel useful shapes and articles that comprise PTFE.

Additional objects, advantages and novel features of the present invention will be set forth in part in the description which follows, and in part will become apparent to those skilled in the art on examination of the following, or may be learned by practice of the invention. The objects and advantages of the invention may be realized and attained by means of the instrumentalities and combinations particularly pointed out in the appended claims.

The present invention provides a melt-processible fluoropolymer having a peak melting temperature of at least 320° C. and good mechanical properties. And compositions and articles comprising at least in part a continuous polymeric phase comprising a melt-processible fluoropolymer having a peak melting temperature of at least 320° C. and good mechanical properties.

The present invention also provides a composition comprising a melt-processible tetrafluoroethylene polymer, or a melt-processible blend of two or more tetrafluoroethylene polymers wherein said polymer or said blend of two or more polymers has good mechanical properties. And a process for producing a melt-processible composition comprising a melt-processible tetrafluoroethylene polymer, or a melt-processible blend of two or more tetrafluoroethylene polymers wherein said polymer or said blend of two or more polymers has good mechanical properties. Also a method for producing an article comprising melt-processing a composition comprising a melt-processible tetrafluoroethylene polymer, or a melt-processible blend of two or more tetrafluoroethylene polymers wherein said polymer or said blend of two or more polymers has good mechanical properties.

Another aspect of the present inventions includes using the melt-processible polymer or polymer composition as an adhesive. The present invention provides a process for connecting parts comprising adhering a part to at least one further part with the polymer or composition of the present invention.

DETAILED DESCRIPTION OF THE INVENTION

The following is a list of defined terms used herein:

Void free—refers to a polymer or polymer composition, below its crystallization temperature, having a void content lower than sintered tetrafluoroethylene polymers including sintered tetrafluoroethylene polymers modified up to 0.1 wt % with PPVE (which are reported to have a void content of 2.6‰ or higher in the Modem Fluoropolymers, J. Scheirs, Ed. Wiley (New York 1997) at p. 253). Preferably, void free refers to a polymer or polymer composition, below its crystallization temperature, having a void content lower than 2‰ as determined by measuring gravimetrically the (apparent) density of a specimen and the intrinsic density via its IR spectroscopically determined amorphous content (as discussed in the Modem Fluoropolymers, J. Scheirs, Ed. Wiley (New York 1997) at pp. 240–255, in particular p. 253; the entire disclosure of which is, 1997, p. 240).

Monomeric units—refers to a portion of a polymer that corresponds to the monomer reactant used to form the polymer. For example, —$CF_2CF_2$— represents a monomeric unit derived from the monomer reactant tetrafluoroethylene.

The poly(tetrafluoroethylene)s

The PTFE's according to the present invention generally are polymers of tetratluoroethylene. Within the scope of the present invention it is contemplated, however, that the PTFE may also comprise minor amounts of one or more co-monomers such as hexafluoropropylene, perfluoro(methyl vinyl ether), perfluoro(propyl vinyl ether), perfluoro-(2,2-dimethyl-1,3-dioxole), and the like, provided, however that the latter do not significantly adversely affect the unique properties, such as thermal and chemical stability of the PTFE homopolymer. Preferably, the amount of co-monomer does not exceed about 5 weight percent, and more preferred are PTFE's that comprise less than about 1 weight percent of co-monomer. Preferably, the amount of such co-monomer does not exceed about 3 mole percent (herein "mol %'), and more preferably less than about 1 mol %, particularly preferred is a co-monomer content of less than 0.5 mol %. In the case that the overall co-monomer content is greater than 0.5 mol %, it is preferred that amount of the a perfluoro(alkyl vinylether) co-monomer is less than about 0.5 mol %; and more preferably less than about 0.2 mol %. Suitable polymers include those having a peak melting temperature, as measured under standard conditions, that exceeds about 320° C., preferably above 325° C. and more particularly above 327° C. Preferably the polymer will have no peak melting temperatures below 320° C. and more preferably the polymer will have a single peak melting point which is above 320° C. Most preferred are PTFE homopolymers.

In addition, suitable poly(tetrafluoroethylene)s according to the present invention include those having good mechanical properties, such as, for example, a highly beneficial thermoplastic flow behavior. An indication of the thermoplastic flow behavior of the polymer can be readily analyzed with the commonly employed method of the determination of a melt-flow index (MFI). The latter method, for the present PTFE's is conveniently and reproducibly carried out according to ASTM test D1238-88, at 380° C. under a load of 21.6 kg, herein referred to as the melt flow index or alternatively MFI (380/21.6). Under these experimental conditions, and in a maximum extrudate-collection time of 1 hr, conventional ultra-high molecular weight PTFE grades have an MFI of zero. Preferably, the PTFE grades according to the present invention have a non-zero MFI (380/21.6) of less than about 50 g/10 min in a maximum extrudate-collection time of 1 hr. More preferably, the PTFE's are characterized by an MFI (380/21.6) between about 0.0005 and about 25 g/10 min. Although the choice of the PTFE grades used will to some extent depend on the particular end product, an MFI range of about 0.25 to about 2 g/10 mm is preferred for most applications.

Preferably, the PTFE grades according to the present invention have a non-zero MFI (380/21.6) of less than about 2.5 g/10 min in a maximum extrudate-collection time of 1 hr. More preferably, the PTFE's are characterized by an MFI (380/21.6) between about 0.0005 and about 2.5 g/10 min, more preferably between about 0.2 g/10 min and about 2.5 g/10 min and most preferably between 0.25 g/10 min and about 2.5 g/10 min. Although the choice of the PTFE grades used will to some extent depend on the particular end product, an MFI range of about 0.25 to about 2 g/10 min is preferred for most applications. In the case that the PTFE grades according to the present invention comprise a relatively high content of comonomer the upper limit of the MFI range of the preferred grades could be higher. For example, if the PTFE contains up to 3 mol % of comonomer, the upper limit of the MFI range could extend up to about 25 g/10 min, and a preferred range would be between 0.1 up to about 15; when the comonomer content is about 1 mol % or less, the MFI range may extend up to about 15 g/10 min, more preferably the MFI range would be between 0.1 up to about 10; and at a content of 0.3 mol % or less the suitable MFI would next exceed about 5 g/10 min and more preferably would have an MFI value in the above-noted range for PTFE polymers.

The highly beneficial thermoplastic flow behavior of the poly(tetrafluoroethylene)s according to the present invention is characterized by their linear visco-elastic behavior, which is conveniently expressed as the absolute value of the complex viscosity. Preferably, the PTFE grades according to the present invention have a plateau value of the complex viscosity measured at frequencies below about 0.01 rad/s and at a temperature of 380° C. of between about $4.10^5$ and about $10^9$ Pa.s; preferably between about $7.10^5$ and about $10^8$ more preferably at least $1.5 \times 10^7$ Pa.s; and most preferred between about $10^6$ and about $5.10^7$ Pa.s.

The poly(tetrafluoroethylene)s according to the present invention in addition to having good mechanical properties, are characterized in a relatively low crystallinity which is beneficial for the toughness of products fabricated thereof. This degree of crystallinity is conveniently determined by differential scanning calorimetry (DSC) according to standard methods known to those skilled in the art of polymer analysis. Preferably, once-molten PTFE grades according to the present invention that are recrystallized by cooling under ambient pressure at a cooling rate of 10° C./min in unoriented form have a degree of crystallinity of between about 1% about 60%, preferably between about 5% and about 60%, more preferably at least about 45% and not more than 55% based on a value of 102.1 J/g for 100% crystalline PTFE (Starkweather, H. W., Jr. et al., J. Polym. Sci., Polym. Phys. Ed., Vol. 20, 751 (1982)).

Preferably, the PTFE grades according to the present invention are characterized by an MFI (380/21.6) between about 0.25 to about 2 g/10 min and a degree of crystallinity of once-molten and recrystallized unoriented material of between about 5%, preferably above 45% and less then about 60%, preferably less than 55%. More preferably, the PTFE polymer is a polymer having a single peak melting point temperature which is above 325° C. and is preferably a homogenous blend of polymers and/or homopolymer.

The PTFE grades of the present invention can be synthesized according to standard chemical methods for the polymerization of tetrafluoroethylene as described in detail in the literature (for example, W. H. Tuminello et al., Macromolecules, Vol. 21, pp. 2606–2610 (1988)) and as practiced in the art. Additionally, PTFE grades according to the present invention can be prepared by controlled degradation of common, high molecular weight PTFE, for example by controlled thermal decomposition, electron beam, gamma- or other radiation, and the like (Modern Fluoropolymers, J. Scheirs, Ed. Wiley (New York), 1997 the entire disclosure of which is hereby incorporated by reference). Furthermore, and as demonstrated in the present invention, the PTFE grades according to the present invention can be manufactured by blending of, for example, high melt-flow index grades with appropriate amounts of grades of a lower, for instance below 0.5 g/10 min, or even zero melt-flow index to yield mixed materials with values of the melt-flow index, viscosity or crystallinity in the desired range. Due to the relatively simple nature of the MFI-testing method, viscosity measurement and crystallinity determination, using, for example, these analytical tools, those skilled in the art of polymer blending can readily adjust the relative portions of the different PTFE grades to obtain the melt-processible, thermoplastic PTFE compositions according to the present invention.

The present invention also contemplates compositions and articles comprising a continuous phase having at least 15 wt. %, preferably at least 45 wt. %, and more preferably at least 95 wt. % of the melt-processible tetrafluoroethylene polymer including polymers that are formed by blending two or more tetrafluoroethylene polymers of the present invention. An exemplary composition could include a composition or an article wherein the continuous phase composed of at least 99 wt. % of a PTFE homopolymer filled with a filler such as talc, glass and/or other inorganic or organic particles. It may be that the filler comprise a between 10 to 90 wt. %, preferably between 10 and 45 wt % and more preferably less than 30 wt. % of the total composition (including continuous phase and filler).

The compositions according to the present invention optionally may include other polymers, additives, agents, colorants, fillers (e.g., reinforcement and/or for cost-reduction), property-enhancement purposes and the like, reinforcing matter, such as glass-, aramid-, carbon fibers and the like, plasticizers, lubricants, processing aids, blowing or foaming agents, electrically conducting matter, other polymers, including poly(tetrafluoroethylene), fluorinated polymers and copolymers, polyolefin polymers and copolymers, and rubbes and thermoplastic rubber blends, and the like. Depending on the particular application, one or more of the above optional additional ingredients and their respective amounts are selected according to standard practices known to those skilled in the art of standard polymer processing, compounding and applications.

Processing

The PTFE compositions according to the present invention can be processed into useful materials, neat or compounded, single- and multi-component shapes and articles using common melt-processing methods used for thermoplastic polymers that are well known in the art. Typical examples of such methods are granulation, pelletizing, (melt-) compounding, melt-blending, injection molding, melt-blowing, melt-compression molding, melt-extrusion, melt-casting, melt-spinning, blow molding, melt-coating, melt-adhesion, welding, melt-rotation molding, dip-blow-molding, melt-impregnation, extrusion blow-molding, melt-roll coating, embossing, vacuum forming, melt-coextrusion, foaming, calendering, rolling, and the like.

Melt-processing of the PTFE compositions according to the present invention, in its most general form, comprises heating the composition to above the crystalline melting temperature of the PTFE's, which, of once-molten material, typically are in the range from about 310 to about 335° C., e.g. from about 320° C. to about 335° C. (preferably less than 400° C.), although somewhat lower, and higher temperatures may occur, to yield a viscous polymer fluid phase. Unlike standard (ultra-high molecular weight) PTFE above its crystalline melting temperature, the PTFE grades according to the present invention form homogenous melts that can be freed from voids and memory of the initial polymer particle morphology. The latter melt is shaped through common means into the desired form, and, subsequently or simultaneously, cooled to a temperature below the crystalline melting temperature of the PTFE's, yielding an object or article of good and useful mechanical properties. In one preferred embodiment, shaped PTFE melts are rapidly quenched at a cooling rate of more than 10° C./min, more preferably more than 50° C./min, to below the crystallization temperature to yield objects, such as fibers and films, of higher toughness.

Certain articles, such as, but not limited to, fibers and films made according to the present invention optionally may, subsequently, be drawn or otherwise deformed in one or more directions, embossed, and the like to further improve the physico-chemical, mechanical, barrier, optical and/or surface properties, or be otherwise post-treated (for instance, quenched, heat treated, pressure treated, and/or chemically treated). The above methods and numerous modifications thereof and other forming and shaping, and post-processing techniques are well know and commonly practiced. Those skilled in the art of processing of thermoplastic polymers are capable of selecting the appropriate melt-processing and optional post-processing technology that is most economical and appropriate for the desired end product, or product intermediate.

Products and Applications

The products contemplated according to the present invention are numerous, and cover vastly different fields of applications. This is especially true as PTFE has been approved for food contact and for biomedical applications. Without limiting the scope and use of the present invention, some illustrative products are indicated hereafter. Generally speaking, the products and materials according to the present invention include most or all applications that currently are covered by standard (ultra-high molecular weight) PTFE, and many of its modified, melt-processible co-polymers. In many cases, the present products, when compared with the latter, will have superior physical-chemical properties due to their predominant homopolymer character. Thus, applications are envisioned, among other industries, in the wire and cable industry, the printed-circuit board industry, the chemical processing industry, the semiconductor industry, the automotive industry, out-door products and coatings industry, the food industry, the biomedical industry, and more generally in industries and uses where any combination of high release, anti-stick, high-temperature stability, high chemical resistance, flame-resistance, anti-fouling, UV resistance, low friction, and low dielectric constant is required.

In particular, the PTFE may be used to form at least parts in articles such as, for example, is a wire (and/or wire coating), an optical fiber (and/or coating), a cable, a printed-circuit board, a semiconductor, an automotive part, an outdoor product, a food, a biomedical intermediate or product, a composite material, a melt-spun mono- or multi-filament fiber, an oriented or un-oriented fiber, a hollow, porous or dense component; a woven or non-woven fabric, a filter, a membrane, a film, a multi-layer-and/or multicomponent film, a barrier film, a container, a bag, a bottle, a rod, a liner, a vessel, a pipe, a pump, a valve, an O-ring, an expansion joint, a gasket, a heat exchanger, an injection-molded article, a see-through article, a sealable packaging, a profile, and/or a thermoplastically welded part. Preferred articles may include fibers, films, coatings and articles comprising the same.

Typical examples of intermediate and end-user products that can be made according to the present invention include, but are not limited to granulate, thermoplastic composites, melt-spun mono- and multi-filament fibers, oriented and not, hollow, porous and dense, single- and multi-component; fabrics, non-wovens, cloths, felts, filters, gas house filtration bags; sheets, membranes, films (thin and thick, dense and porous); containers, bags, bottles, generally simple and complex parts, rods, tubes, profiles, linings and internal components for vessels, tanks, columns, pipes, fittings, pumps and valves; O-rings, seals, gaskets, heat exchangers, hoses, expansion joints, shrinkable tubes; coatings, such as protective coatings, electrostatic coatings, cable and wire coatings, optical fiber coatings, and the like. The above products and articles may be comprised in part or in total PTFE compositions according to the present invention, or optionally include dissimilar materials, such as for example in multi-layer and multi-component films, coatings, injection molded articles, containers, pipes, profiles, and the like.

Due to the fact that the PTFE grades according to the present invention can be readily processed into mechanical coherent, tough, thin, dense and/or translucent objects, novel application areas for PTFE are contemplated that heretofore were not readily or economically, if at all, accessible due to the intractability of standard (ultra-high molecular weight) grades, notably in areas where the absence of remnants of powder morphology and voids have prohibited use of the latter material. Preferably, the polymer of the present invention has sufficient clarity such that if it were formed into a 1 mm thick film, and tested at a temperature below its crystallization temperature, it would be sufficiently translucent to enable images viewed through the film to be readily recognized, preferably without distortion.

Exemplary applications of the polymer and polymer composition of the present which take advantage of some of these beneficial properties include see-through, sealable packaging, barrier films and caps, conformal coatings, dense tubing and linings, thin-walled and complex injection-molded parts, and the like.

The PTFE grades according to the present invention, due to their thermoplastic nature, not only are useful for the simple and economic production of finished goods and intermediate products, but also for other functions. An illustrative example of such function, without limiting the scope of the present invention, is adhesion and welding. The latter is a well-recognized difficulty associated with common PTFE (Modern Fluoropolymers, J. Scheirs, Ed. Wiley (New York), 1997, p. 251). The PTFE grades according to the present invention were found to be outstanding adhesives, for example, for itself as well as for other fluoropolymers, preferably including common high-molecular weight PTFE products such as films, sheets and the like. Simply by inserting a small amount of a PTFE grade according to the present invention in powder, film or other form between two or more surfaces that one desires to adhere together, liquefying the former material, and subsequently solidifying under slight or modest pressure, it was found to yield a very strong adhesive bond that was provided by the inventive PTFE grades.

The following specific examples are presented to illustrate various aspects of the present invention and are not to be construed as limitations thereon.

EXAMPLES

The following examples are given as particular embodiments of the invention and to demonstrate the practice and advantages thereof. It is understood that the examples are given by way of illustration and are not intended to limit the specification or the claims that follow in any manner.

General Methods and Materials

Melt-Flow Index. Values of the melt flow index (MFI) as discussed herein are determined in accordance with the ASTM Standard D1238-88 at a temperature of 380° C. and under a load of 216 kg during a maximum extrudate-collection time of 1 hr using a Zwick 4106 instrument.

Viscosity. The absolute values of the complex viscosities of different PTFE grades were measured from small amplitude oscillatory shear experiments (Rheometrics Dynamic Spectrometer RDS-II) at 380° C. for several frequencies between 100 rad/s and $3.10^{-3}$ rad/s using standard plate-plate geometry. The linear range was estimated from strain-sweep experiments at 100 rad/s.

Thermal Analysis. Thermal analysis was conducted with a Netzsch differential scanning calorimeter (DSC, model 200). Samples of about 5 mg were heated at a standard rate of 10° C./min. Melting temperatures given hereafter refer to the endotherm peak temperatures of once molten (at 380° C.) and cooled (at 10° C./min) material. Crystallinities were determined from the enthalpies of fusion of the same specimen taking the value of 102.1 J/g for 100% crystalline PTFE (Starkweather, H. W., Jr. et al., J. Polym. Sci., Polym. Phys. Ed., Vol. 20, 751 (1982)).

Mechanical Data. Tensile tests were carried out with an Instron Tensile Tester (model 4411) at room temperature on dumbbell-shaped specimen of 12 mm gauge length and 2 mm width and fibers. The gauge fiber length was 20 mm. The standard rate of elongation was 100%/min.

Materials. Various grades of PTFE, purchased from Du Pont (Teflon®, Zonyl®), Ausimont (Algoflon®) and Dyneon, were used. The following Table I presents an overview of the melting temperatures and the crystallinities of materials that were once molten at 380° C. and recrystallized by cooling at 10° C./min, and MFI (380/21.6) of the different grades, which include grades both outside the invention, and those according to the present invention.

TABLE I

| PTFE grade | | Melting Temperature* (° C.) | Crystallinity (%) | MFI (380/21.6) (g/10 min) |
|---|---|---|---|---|
| I | Zonyl ® 1200 | 325.9 | 64.8 | >>1,000 |
| II | Zonyl ® 1100 | 325.0 | 67.2 | >1,000 |
| III | Zonyl ® 1600 | 329.0 | 68.9 | 150 |
| IV | Dyneon ® 9207 | 329.8 | 65.1 | 55 |
| V | Zonyl ® 1000 | 329.3 | 59.5 | 52 |
| VI | blend ® V/XX** | 331.6 | 60.5 | 35 |
| VII | Dyneon ® 9201 | 330.5 | 60.9 | 22 |
| VIII | blend ® V/XX** | 331.4 | 59.9 | 15 |
| IX | Zonyl ® 1300 | 329.9 | 60.5 | 10 |
| X | Algoflon ® F5A EX | 330.7 | 61.7 | 9 |
| XI | Zonyl ® 1400 | 330.8 | 57.3 | 2.8 |
| XII | Algoflon ® L206 | 332.3 | 60.8 | 2.6 |
| XIII | blend ® IX/XX** | 331.2 | 51.9 | 1.8 |
| XIV | blend ® XI/XIX** | 329.3 | 49.9 | 1.2 |
| XV | blend ® V/XIX** | 329.4 | 51.4 | 1.0 |
| XVI | blend ® XI/XIX** | 329.7 | 47.6 | 0.8 |
| XVII | blend ® IX/XX** | 330.5 | 50.9 | 0.8 |
| XVIII | blend ® IX/XX** | 331.5 | 47.5 | 0.6 |
| XIX | Zonyl ® 1500 | 327.5 | 44.2 | 0.2 |
| XX | Teflon ® 6 | 328.6 | 33.7 | 0 |

*Note: all grades exhibited the well-know thermal transitions around room temperature, typical of PTFE, and only one main melting endotherm at the elevated temperatures above indicated.
**for compositions and preparation of blends see Example 7.

Comparative Example A

PTFE grades I–XII (Table I) were melt-compression molded at 380° C. with a Carver press (model M, 25 T) for 5 min at 1 metric ton (t), 10 min at 10 t, and then cooled to room temperature during 4 min under 4 t into plaques of about 4×4×0.1 cm. All grades were found to yield brittle products most of which could not be removed from the mold without fracture. This example shows that neat grades of PTFE of MFI values more than about 2.5 cannot be employed to melt-process articles of useful mechanical properties.

Example 1

Example A was repeated with PTFE grades XIII–XVIII. The materials were melt-compression molded at 380° C. with a Carver press (model M, 25 T) for 5 min at 1 metric ton (t), 10 min at 10 t, and then cooled to room temperature during 4 min under 4 t into plaques of about 4×4×0.1 cm. These grades were found to yield mechanically coherent, and translucent samples that could readily be removed from the mold and bend without fracture. This example shows that grades of a non-zero MFI value, but less then about 2.5 can be employed to melt-process articles of PTFE of useful mechanical properties.

Comparative Example B

Attempts were made to melt-compression mold at 380° C. with a Carver press (model M, 25 T) films of PTFE grades I-XII. All grades were found to yield brittle products that could not be mechanically removed from the mold without fracture. This example shows that neat grades of MFI values more then about 2.5 cannot be employed to produce melt-processed, free-standing films of useful mechanical properties.

Example 2

Example B was repeated with PTFE grades XIII–XVIII. The materials were melt-compression molded at 380° C. with a Carver press (model M, 25 T) for 5 min at 1 metric ton (t), 10 min at 10 t, and then cooled to room temperature during 4 min under 4 t into thin films of about 15×15× about 0.025 cm. These grades were found to yield mechanically coherent, translucent and flexible films that could readily be removed from the mold. This example shows that grades of a non-zero MFI value, but less then about 2.5 can be employed to melt-process thin, mechanically coherent films of PTFE.

Figure 1:
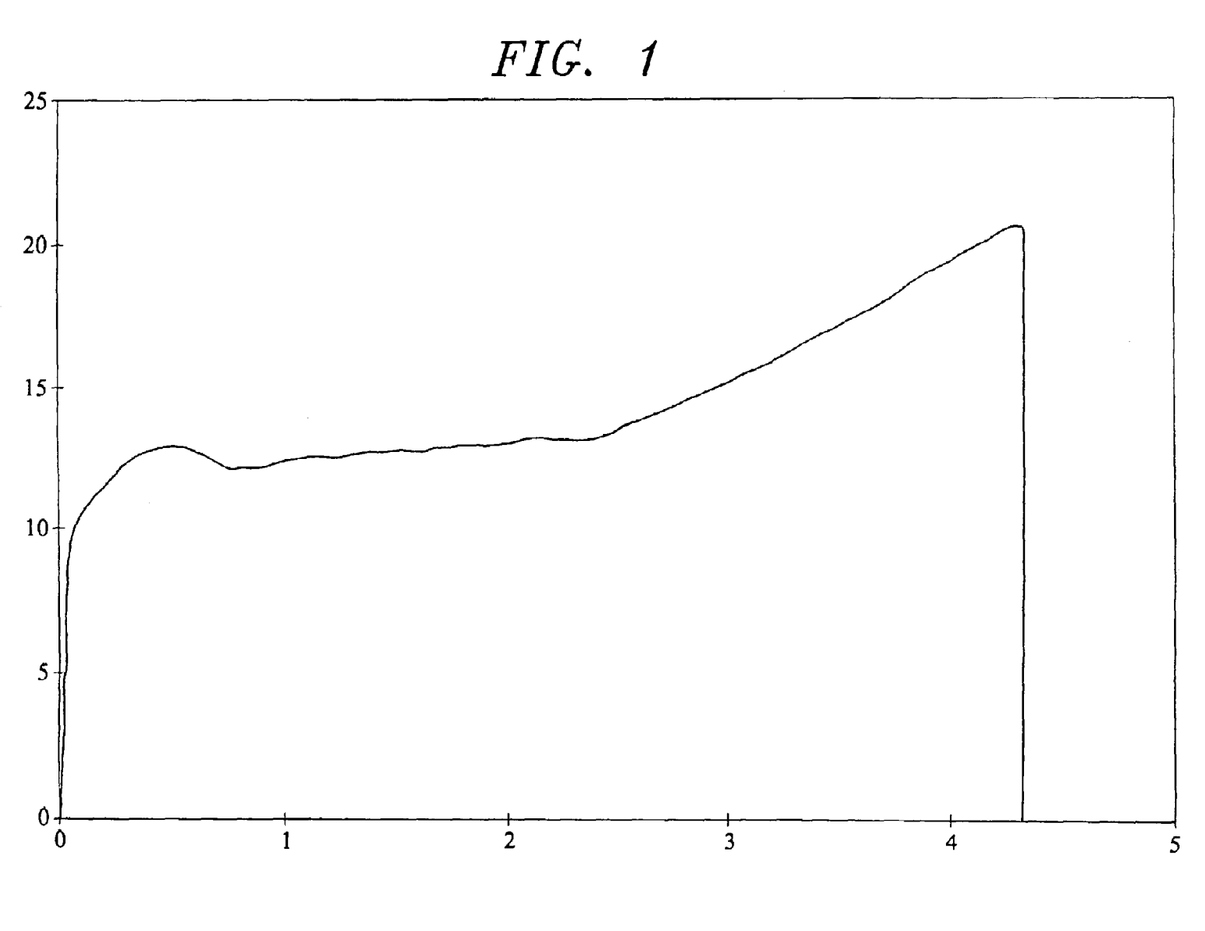
FIG. 1 is a stress-strain curve of a melt-processed film of PTFE according to the present invention.
Figure 2:
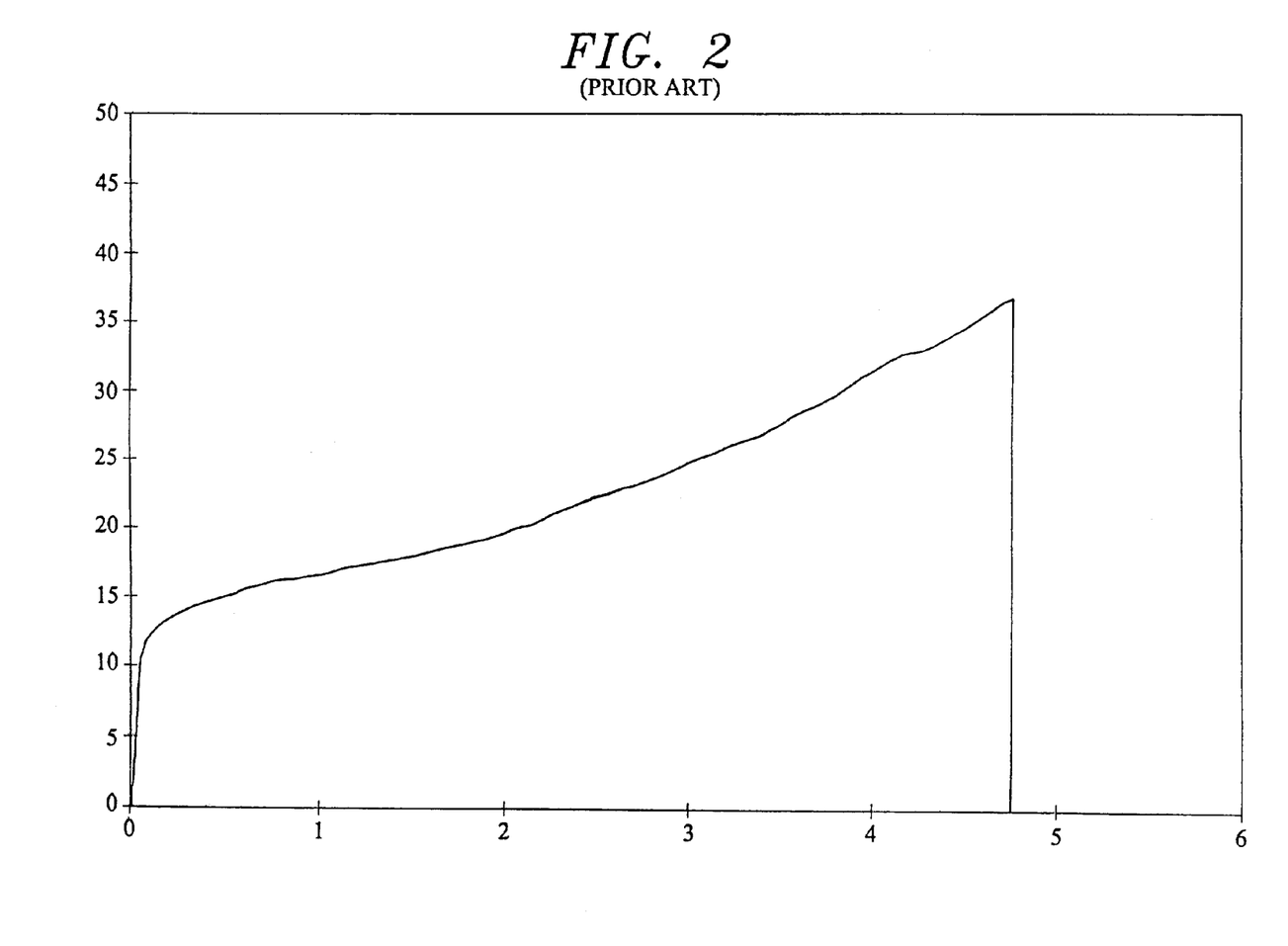
FIG. 2 is a prior art commercial, sintered and skived film of standard (ultra-high molecular weight) PTFE.

The mechanical properties of the melt-processed PTFE films were measured according to the standard method detailed above. A typical stress-strain curve is presented in FIG. 1(A), for comparison purposes, together with that of a sample of commercial, pre-formed/sintered and skived film of 0.40 mm thickness (B). This figure shows that the melt-processed PTFE film (here of grade XVI (Table I)) has the typical deformation properties of a thermoplastic, semi-crystalline polymer with a distinct yield point and strain hardening. The stress-strain curves A and B resemble each other, which indicates that these melt-processed PTFE films do not have substantially inferior mechanical properties when compared to common, PTFE of ultra-high molecular weight. The mechanical data of the two products are collected in Table II.

TABLE II

| PTFE film | Yield Stress (MPa) | Tensile Strength (Nominal, MPa) | Elongation at Break (%) |
| --- | --- | --- | --- |
| Skived Film | 12.8 | 36.1 | 476 |
| Melt-processed Film of PTFE grade XVI | 12.6 | 20.9 | 427 |

The excellent mechanical properties of the film according to the present invention were not affected by storing the sample for periods in excess of 15 hrs at temperatures of 200° C. and higher.

In addition, we observed that the melt-processed PTFE films, unlike the commercial skived material, were dense and translucent, through which text readily could be read up to a film thickness of about 1 mm.

Comparative Example C

PTTE grades I–XII and XX were introduced into a laboratory melt-spinning apparatus (SpinLine, DACA Instruments), the temperature of which was kept at 380° C., and that was equipped with a die of 1 mm diameter (length/diameter ratio 1). PTFE grades I–XII could not be collected as monofilaments due to brittleness of the extrudate, leading to premature fracture. Ultra-high molecular weight PTFE grade XX could not be melt-spun, even at loads up to 5 kN (limit of equipment), due to the high viscosity (zero MFI) of the material.

Example 3

Example C was repeated with PTFE grade XV. PTFE monofilaments were collected onto bobbins. The filaments were tough, and could readily be drawn at room temperature to draw ratios exceeding 4.

The mechanical properties of the melt-spun fibers were measured according to the method detailed above. Their tensile strength exceeded 0.1 GPa.

Comparative Example D

PTFE grades I–XII and XX were introduced into a laboratory, recycling twin-screw extruder (MicroCompounder, DACA Instruments), the temperature of which was kept at 380° C., and that was equipped with an exit die of 2 mm diameter. PTFE grades I–XII could not be collected as continuous extrudates due to extreme brittleness of the extrudate, leading to premature fracture. Ultra-high molecular weight PTFE grade XX could not be extruded due to the high viscosity (zero MFI) of the material.

Example 4

Example D was repeated with PTFE grades XIII–XVIII. Continuous PTFE extrudates were readily collected. The extrudates could readily be chopped into granulate or drawn into monofilaments.

Example 5

PTFE grade XV was melt-compounded at 380° C. in a Brabender DSK25 segmented, co-rotating extruder (25 mm diameter; 22 aspect ratio) with 0.1 weight % of various dyes (Amaplast® Blue HB, Red RP, Yellow NX, ColorChem Int. Corp.), 10% of $TiO_2$ (Fluka), 10 weight % of aramid pulp (Twaron®, Akzo Nobel), and 20 weight % of chopped, 15 mm long carbon fiber, respectively. Subsequently, the compounded materials obtained were melt-processed into plaques according to the method in Example 1. Optical microscopy on thin sections (about 0.1 mm) revealed that in all cases extremely homogeneous mixtures and composites were obtained. This example shows that PTFE according to the present invention can be melt-compounded.

Comparative Example E

Two strips of about 7×1×0.04 cm of commercial, skived film of high molecular weight PTFE were pressed together in a Carver press (model M, 25T) at a temperature of 380° C. under a load of less than 1 t for 2 min and subsequently cooled to room temperature. Without much force, the strips could be separated from each other, which is indicative of poor adhesion, and illustrates the difficulties encountered in welding of common PTFE.

Example 6

Example E was repeated. However, a small piece of melt-processed film of PTFE grade XV (about 1×1×0.02 cm) was placed in between the two strips of about 7×1×0.04 cm of commercial, skived film of high molecular weight PTFE. This sandwich structure was also pressed together in a Carver press (model M, 25T) at a temperature of 380° C. under a load of less than 1 t for 2 min and, subsequently, cooled to room temperature. The strips could be separated from each other only after one or both of the skived material strips exhibited excessive plastic deformation, which is indicative of outstanding adhesive properties of this grade to, for example, common PTFE.

Example 7

Various amounts (total quantity 90 g) of PTFE grades V and XIX, XI and XIX, and IX and XX, respectively, (see Table I) were introduced into a Brabender melt-kneader (model Plasti-corder PL 2000), which was kept at a temperature of about. 380° C., 60 rpm. After about 1 min, a clear homogeneous melt was formed that behaved like a melt of ordinary thermoplastics. Mixing was continued for 10 min, after which the blended product was discharged. The MFI values of the different blends were measured. The results are given in Table III.

TABLE III

| PTFE grades | Weight Ratio (−) | MFI (380/21.6) (g/10 min) |
|---|---|---|
| IX + XX | 45–55 | 0.6 |
| IX + XX | 50–50 | 0.8 |
| XI + XIX | 10–90 | 0.8 |
| V + XIIX | 12.5–87.5 | 1.0 |
| XI + XIX | 25–75 | 1.2 |
| IX + XX | 60–40 | 1.8 |

This example shows that PTFE grades according to the present invention of an MFI value in the desired range can be prepared by melt-blending of PTFE grades of which one or more are of too high or/and too low values of their respective MFI.

Example 8

Various amounts (total quantity 90 g) of PTFE grades V and XIX, and IX and XX, respectively, (see Table 1) were introduced into a Brabender melt-kneader (model Plasti-corder PL 2000), which was kept at a temperature of about 380° C., 60 rpm. After about 1 min, a clear homogeneous melt was formed that behaved like a melt of ordinary thermoplastics. Mixing was continued for 10 min, after which the blended product was discharged. The absolute values of the complex viscosities of various PTFE samples were measured from small amplitude oscillatory shear experiments. The results are given in Table IV.

TABLE IV

| PTFE grades | Weight Ratio (−) | Viscosity (Pa.s) |
|---|---|---|
| V + XIX | 60–40 | $9.3 \cdot 10^5$ |
| V + XIX | 40–60 | $5.5 \cdot 10^6$ |
| V + XIX | 20–80 | $8.4 \cdot 10^6$ |
| V + XIX | 10–90 | $1.3 \cdot 10^7$ |
| IX + XX | 60–40 | $1.2 \cdot 10^7$ |
| IX + XX | 50–50 | $1.8 \cdot 10^7$ |
| IX + XX | 45–55 | $2.4 \cdot 10^7$ |

The same PTFE samples were processed into films according to the method in Example 2. All films were found to exhibit good mechanical properties.

Having described specific embodiments of the present invention, it will be understood that many modifications thereof will readily appear or may be suggested to those skilled in the art, and it is intended therefore that this invention is limited only by the spirit and scope of the following claims.

What is claimed is:

1. A method for producing an article comprising:
   (i) heating a composition consisting of
       (a) a poly(tetrafluoroethylene) polymer, and
       (b) optionally, one or more additives, selected from the group consisting of colorants, fillers, reinforcing matter, electrically conducting matter, plasticizers, lubricants, processing aids, blowing agents, and foaming agents, to above the crystalline melting temperature of said polymer; and
   (ii) injection molding said composition;
   wherein said polymer has a peak melting temperature that exceeds about 320° C.

2. The method of claim 1, wherein said polymer has a melt-flow index of at most about 50 g/10 min.

3. The method of claim 1, wherein said polymer has a melt-flow index of at most about 25 g/10 min.

4. The method of claim 1, wherein said polymer has a melt-flow index of at least 0.25 g/10 min.

5. The method of claim 1, wherein said polymer comprises perfluoro(alkyl vinylether) co-monomer.

6. The method of claim 1, wherein said polymer has a void content below 2‰.

7. The method of claim 1, wherein said method includes melt-extruding.

8. The method of claim 1, wherein said method includes pelletizing.

9. The method of claim 1, wherein said polymer comprises less than 0.5 mol % co-monomer.

10. The method of claim 1, wherein said polymer has no peak melting temperature below 320° C.

11. The method of claim 1, wherein said composition comprises said one or more additives.

12. A method for producing an article comprising:
   (i) heating a composition consisting of
       (a) a poly(tetrafluoroethylene) polymer, and
       (b) optionally, one or more additives, selected from the group consisting of colorants, fillers, reinforcing matter, electrically conducting matter, plasticizers, lubricants, processing aids, blowing agents, and foaming agents, to above the crystalline melting temperature of said polymer; and
   (ii) melt-extruding, injection molding, and/or melt-spinning said composition;

wherein said polymer has a crystalline melting temperature in the range of 310 to 335° C. and a co-monomer content of less than 1 mol %, and wherein all said co-monomer consists essentially of co-monomer selected from the group consisting of hexafluoropropylene and perfluoro(alkyl vinylether).

13. The method of claim 12, wherein said method includes said melt-extruding.

14. The method of claim 13, wherein said melt-extruding includes melt-coextruding.

15. The method of claim 12, wherein said polymer comprises less than 0.5 mol % co-monomer.

16. The method of claim 12, wherein said composition comprises said one or more additives.

17. An article obtained by the method of claim 1.

18. The article of claim 17, wherein said article is a fiber.

19. An article obtained by the method of claim 12.

20. The article of claim 19, wherein said article is a film.

21. A method for producing an article comprising:
    (i) heating a composition consisting of
        (a) a poly(tetrafluoroethylene) polymer, and
        (b) optionally, one or more additives, selected from the group consisting of colorants, fillers, reinforcing matter, electrically conducting matter, plasticizers, lubricants, processing aids, blowing agents, and foaming agents, to above the crystalline melting temperature of said polymer; and
    (ii) melt spinning said composition;
        wherein said polymer has a peak melting temperature that exceeds about 320° C.

22. The method of claim 1, wherein said polymer has an elongation at break of greater than 10%.

23. The method of claim 21, wherein said polymer has an elongation at break of greater than 10%.

24. The method of claim 4, wherein said polymer has an elongation at break of greater than 10%.

25. The method of claim 12, wherein said polymer has a melt-flow index of at least 0.25 g/10 min. and an elongation at break of greater than 10%.

26. The method of claim 23, wherein said polymer has a melt-flow index of at least 0.25 g/10 mm.

27. The method of claim 12, wherein said melting temperature of said polymer is about 320° C.

28. The method of claim 25, wherein said melting temperature of said polymer is about 320° C.

29. The method of claim 12, wherein said polymer has a void content below 2‰.

30. The method of claim 25, wherein said polymer has a void content below 2‰.

31. The method of claim 21, wherein said polymer has a void content below 2‰.

* * * * *